(12) United States Patent
Nakagawa et al.

(10) Patent No.: US 6,433,992 B2
(45) Date of Patent: Aug. 13, 2002

(54) MONOLITHIC CAPACITOR

(75) Inventors: Takuji Nakagawa, Takefu; Yoshikazu Takagi, Sabae; Yasunobu Yoneda, Takefu, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/749,974

(22) Filed: Dec. 28, 2000

(30) Foreign Application Priority Data

Dec. 28, 1999 (JP) ............................................ 11-373021

(51) Int. Cl.⁷ ............................ H01G 4/30; H01G 4/228
(52) U.S. Cl. .................... 361/301.4; 361/303; 361/309; 361/306.3; 361/321.2
(58) Field of Search ............................. 361/301.4, 303, 361/304, 305, 306.1, 306.2, 306.3, 308.1, 309, 310, 321.2, 321.4, 321.5

(56) References Cited

U.S. PATENT DOCUMENTS 6,046,902 A * 4/2000 Nakagawa et al. ...... 361/306.1
6,181,544 B1 * 1/2001 Nakagawa et al. ...... 361/321.1
6,191,933 B1 * 2/2001 Ishigaki et al .............. 361/309
6,201,683 B1 * 3/2001 Yamada et al. .......... 361/308.1
6,288,887 B1 * 9/2001 Yoshida et al. .......... 361/306.1

FOREIGN PATENT DOCUMENTS

JP          1-112032         7/1989

* cited by examiner

Primary Examiner—Anthony Dinkins
(74) Attorney, Agent, or Firm—Keating & Bennett, LLP

(57) ABSTRACT

A monolithic capacitor includes a plurality of monolithic ceramic capacitor elements provided with external electrodes at both ends thereof, solder layers arranged on the entire surfaces of the external electrodes of the monolithic ceramic capacitor elements, and metal terminals electrically connected to the external electrodes of the monolithic ceramic capacitor elements. The monolithic ceramic capacitor elements are joined to each other by the solder layers and are stacked on each other. The external electrodes of the monolithic ceramic capacitor elements are electrically connected to each other by the solder layers.

20 Claims, 12 Drawing Sheets

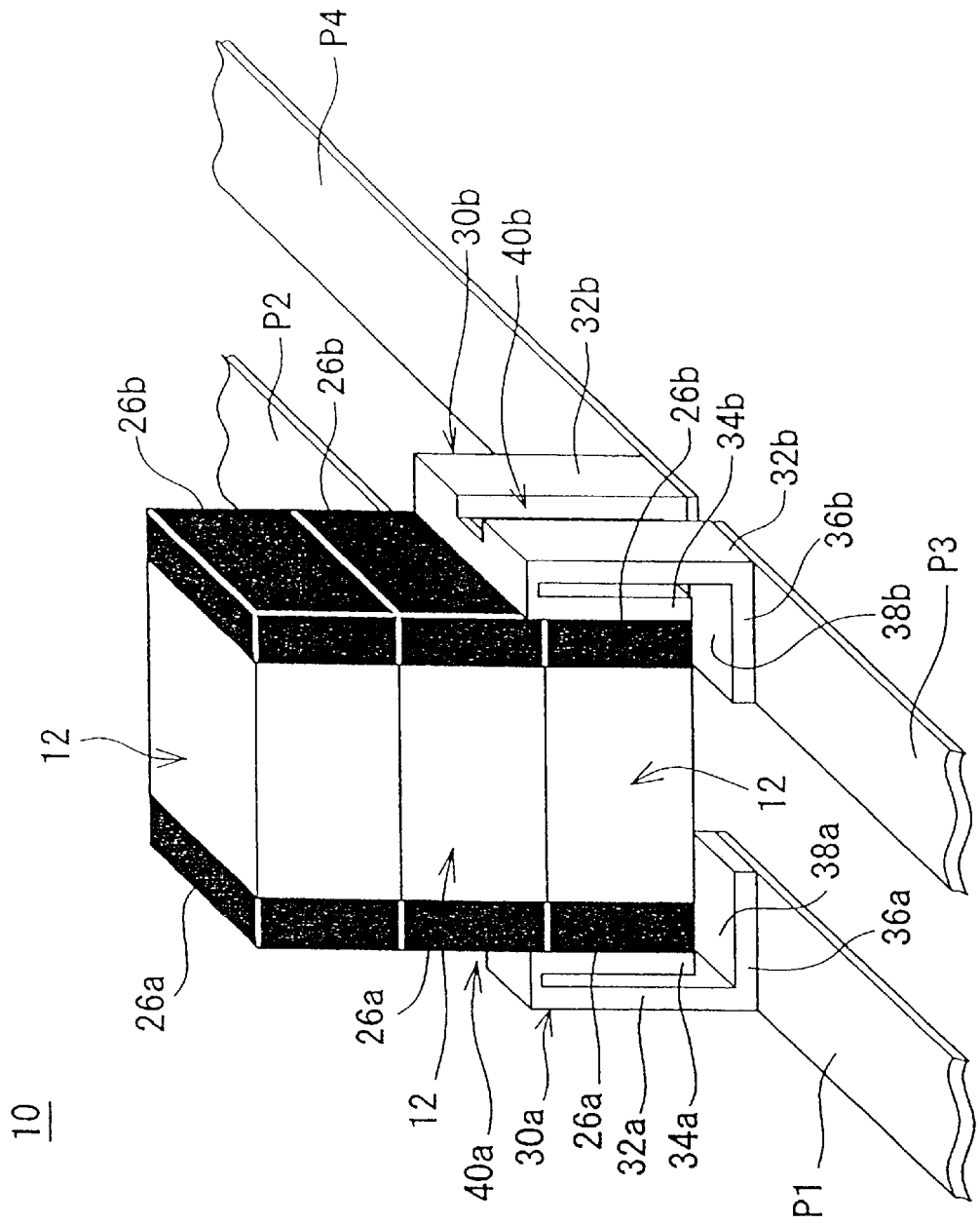

MONOLITHIC CAPACITOR

BACKGROUND OF THE INVENTION

1. Field of the Invention

The present invention relates to a monolithic capacitor, and more particularly, the present invention relates to a monolithic capacitor having high capacitance and which includes a plurality of monolithic ceramic capacitor elements and metal terminals, and used, for example, as a substitute for a tantalum electrolytic capacitor for smoothing a power circuit in a DC—DC converter, or other suitable uses.

2. Description of the Related Art

A monolithic capacitor provided with metal terminals is used in order to improve thermal shock resistance by ensuring bending strength and by relieving thermal stress. In such a monolithic capacitor, monolithic ceramic capacitor elements are supported by metal terminals so as not to contact a substrate. Furthermore, as disclosed in Japanese Unexamined Utility Model Publication No. 1-112032, metal terminals are bent. By using the techniques described above, it is also possible to decrease the difference in thermal expansion between a substrate having a high thermal expansion coefficient, such as an aluminum substrate, and monolithic ceramic capacitor elements.

In such a monolithic capacitor, when a plurality of monolithic ceramic capacitor elements are formed, external electrodes of the monolithic ceramic capacitor elements are partially connected to each other by a conductive resin or a solder paste.

However, with respect to the monolithic ceramic capacitor in which the external electrodes of the monolithic ceramic capacitor elements are partially joined to each other by the conductive resin or the solder paste, thermal stress is concentrated at the joints, and cracks may occur in the joints and the monolithic ceramic capacitor elements, resulting in a decrease in electrostatic capacity.

SUMMARY OF THE INVENTION

In order to overcome the problems described above, preferred embodiments of the present invention provide a monolithic capacitor having high thermal shock resistance while avoiding all of the problems of the prior art.

In accordance with various a preferred embodiment of the present invention, a monolithic capacitor includes a plurality of monolithic ceramic capacitor elements provided with external electrodes at both ends thereof, solder layers arranged on the entire surfaces of the external electrodes of the monolithic ceramic capacitor elements, and metal terminals electrically connected to the external electrodes of the monolithic ceramic capacitor elements. The monolithic ceramic capacitor elements are stacked on each other and are joined to each other by the solder layers, and the external electrodes of the monolithic ceramic capacitor elements are electrically connected to each other by the solder layers.

In the monolithic capacitor of various preferred embodiments of the present invention, preferably, the metal terminals are directly connected to at least one of the monolithic ceramic capacitor elements by the solder layers. In such a case, the metal terminals may not be directly connected to at least one of the other monolithic ceramic capacitor elements.

In the monolithic capacitor of various preferred embodiments of the present invention, preferably, each metal terminal includes a middle section, a tip section located on one edge of the middle section so as to face the middle section with a space therebetween, and an end section located on the other edge of the middle section, in which the tip section imparts spring characteristics to the metal terminal and is connected to the external electrode of the monolithic ceramic capacitor element by the solder layer. In such a case, a film which is resistant to soldering may be provided on the internal surface of the metal terminal.

Furthermore, in the monolithic capacitor of various preferred embodiments of the present invention, a cut-out may be provided on the metal terminal for adjusting the reactance component.

In the monolithic capacitor of preferred embodiments of the present invention, since the solder layers are disposed on the entire surfaces of the external electrodes of the monolithic ceramic capacitors, thermal stress is dispersed by the solder layers, and cracks are prevented from occurring in the joints of the monolithic ceramic capacitor elements and the monolithic ceramic capacitor elements. Therefore, the thermal shock resistance is greatly improved in the monolithic capacitor of preferred embodiments of the present invention.

Other features, elements, characteristics and advantages of the present invention will become more apparent from the following detailed description of preferred embodiments thereof with reference to the attached drawings.

BRIEF DESCRIPTION OF THE DRAWINGS

FIG. 12 is a perspective view of a monolithic capacitor according to a seventh preferred embodiment of the present invention.

DETAILED DESCRIPTION OF PREFERRED EMBODIMENTS

Figure 1:
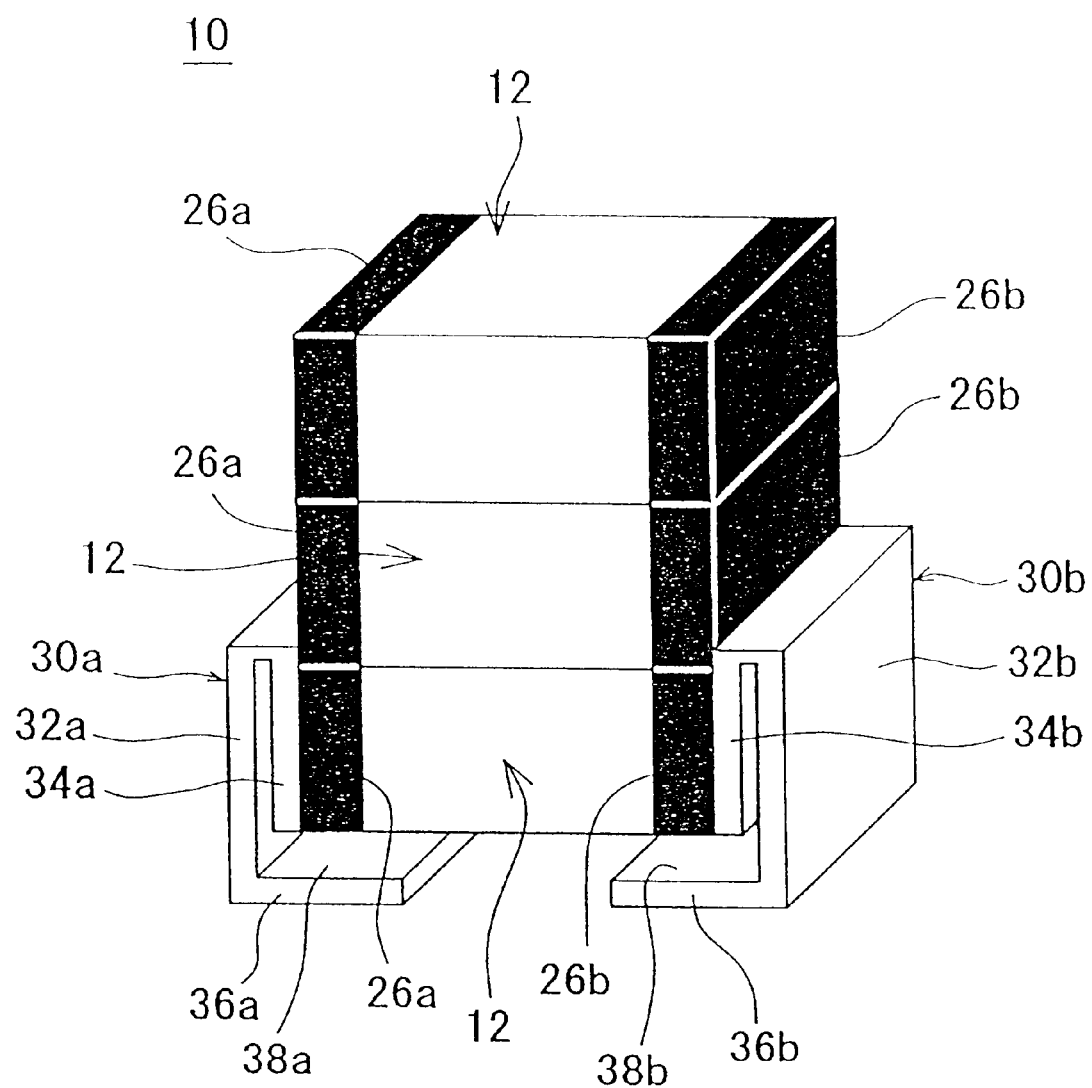
FIG. 1 is a perspective view of a monolithic capacitor according to a first preferred embodiment of the present invention.

FIG. 1 is a perspective view of a monolithic capacitor according to a first preferred embodiment of the present invention. A monolithic capacitor 10 shown in FIG. 1 preferably includes three monolithic ceramic capacitor elements 12.

Figure 2:
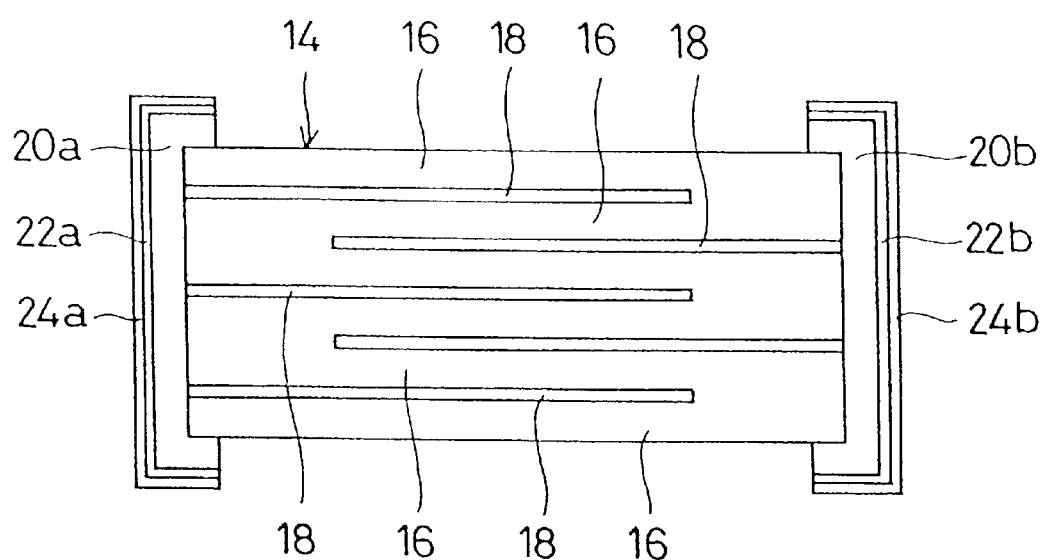
FIG. 2 is a schematic diagram showing a monolithic ceramic capacitor element.

The monolithic ceramic capacitor element 12 includes a laminate 14 as shown in FIG. 2. The laminate 14 includes a plurality of dielectric layers 16 made of, for example, a barium titanate-based dielectric material or other suitable material, and a plurality of internal electrodes 18 made of an electrode material, such as Ni, or other suitable material. The plurality of dielectric layers 16 and the plurality of internal electrodes 18 are alternately laminated. In such a case, every other one of the internal electrodes 18 is arranged to extend to one side of the laminate 14 and the remaining other internal electrodes 18 are arranged to extend to the other side of the laminate 14. On one end including one side of the laminate 14, a Cu layer 20a, an Ni layer 22a, and an Sn layer 24a are located, in that order, to constitute an external electrode. In such a case, a Cu paste is applied at a thickness of about 100 μm on one end of the laminate 14, and drying is performed for approximately 10 minutes at about 150° C., followed by baking at about 800° C. for approximately 5 minutes to form the Cu layer 20a. Next, by wet plating, the Ni layer 22a is formed to have a thickness of about 1 μm and the Sn layer 24a is formed to have a thickness of about 5 μm. Similarly, on the other end including the other side of the laminate 14, a Cu layer 20b, an Ni layer 22b, and an Sn layer 24b are provided, in that order, to constitute an external electrode.

The three monolithic ceramic capacitor elements 12 are connected to two metal terminals 30a and 30b which are preferably made of, for example, an Fe—Cr alloy, by flow soldering, as shown in FIG. 1.

That is, the metal terminal 30a includes a plate-like middle section 32a. On the upper edge of the middle section 32a, a plate-like tip section 34a is arranged to face the middle section 32a. A space may be provided between the tip section 34a and the middle section 32a. The vertical length of the tip section 34a is preferably about 2.5 mm, which is slightly longer than the height of the monolithic ceramic capacitor element 12. A plate-like end section 36a is disposed on the lower edge of the middle section 32a so as to extend in a direction substantially perpendicular to the middle section 32a. Therefore, the tip section 34a imparts spring characteristics to the metal terminal 30a. The external surface of the metal terminal 30a (i.e., surfaces of the middle section 32a and the tip section 34a other than the surfaces facing each other, and the lower surface of the end section 36a connected thereto) is subjected to solder plating. Additionally, when a metal terminal material which is easily soldered, such as brass, is used, on the internal surface of the metal terminal 30a (the surfaces of the middle section 32a and the tip section 34a facing each other, and the upper surface of the end section 36a connected thereto), a film 38a which is resistant to soldering is formed. The film 38a is preferably made of, for example, a metal oxide, a wax, a resin, or a silicone oil, or other suitable material. Similarly, the other metal terminal 30b includes a middle section 32b, a tip section 34b, and an end section 36b, the external surface is subjected to solder plating, and a film 38b which is resistant to soldering is formed on the internal surface.

Solder layers 26a and 26b, preferably made of a high-temperature solder, e.g., Pb:Sn=85:15, are disposed on the entire surfaces of the external electrodes (Sn layers 24a and 24b) of the three monolithic ceramic capacitor elements 12, respectively, by flow soldering. The three monolithic ceramic capacitor elements 12 are stacked and joined to each other via the solder layers 24a, 24b, and the external electrodes are electrically connected to each other, and also, the tip sections 34a and 34b of the metal terminals 30a and 30b are connected to the external electrodes of the lower monolithic ceramic capacitor element 12.

Figure 3:
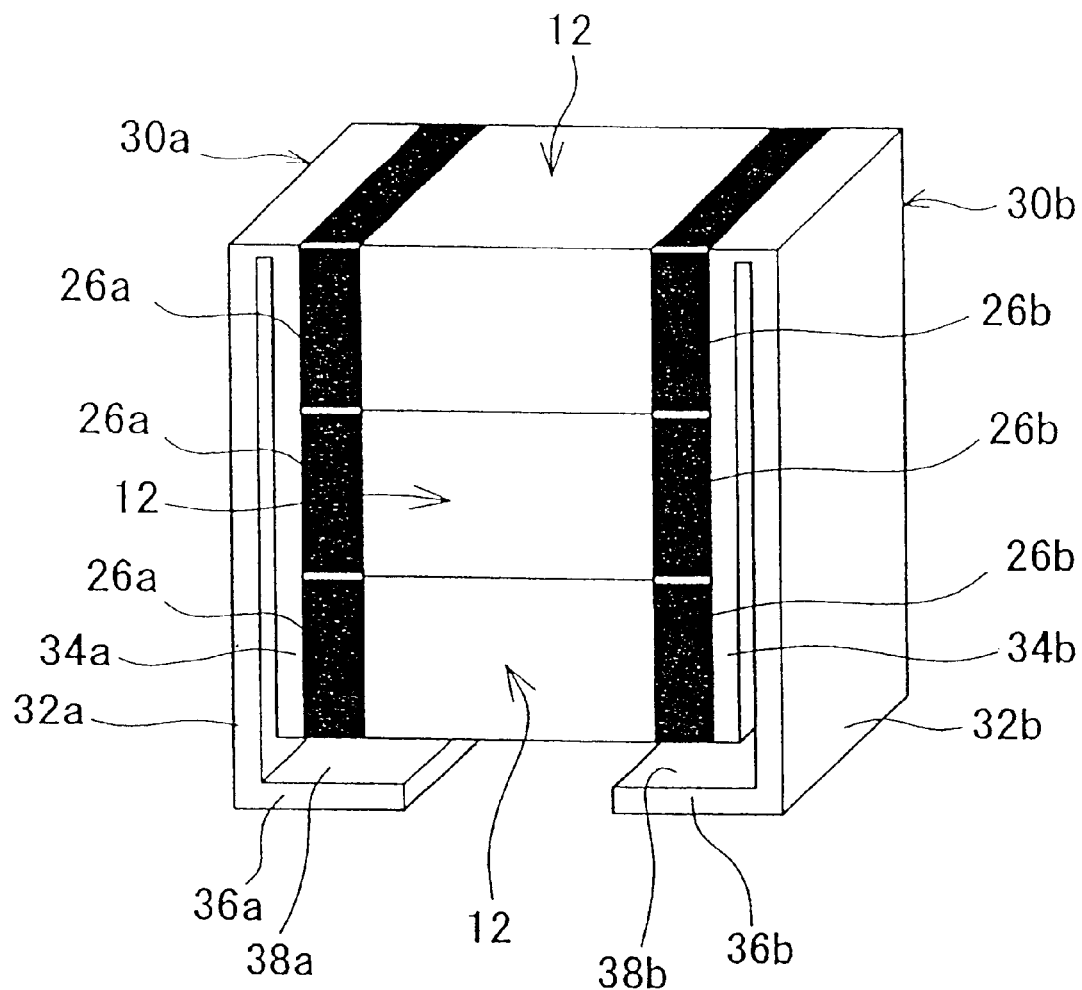
FIG. 3 is a perspective view of a monolithic capacitor according to a second preferred embodiment of the present invention.

FIG. 3 is a perspective view of a monolithic capacitor according to a second preferred embodiment of the present invention. In a monolithic capacitor 10 shown in FIG. 3, differing from the monolithic capacitor 10 shown in FIG. 1, the vertical lengths of tip sections 34a and 34b of metal terminals 30a and 30b are preferably about 7.0 mm, which is substantially equal to the height of three monolithic capacitor elements 12 joined together. Accordingly, the vertical lengths of middle sections 32a and 32b of the metal terminals 30a and 30b are longer. By solder layers 26a and 26b, the tip sections 34a and 34b of the metal terminals 30a and 30b are connected to external electrodes of the three monolithic ceramic capacitor elements 12.

Figure 4:
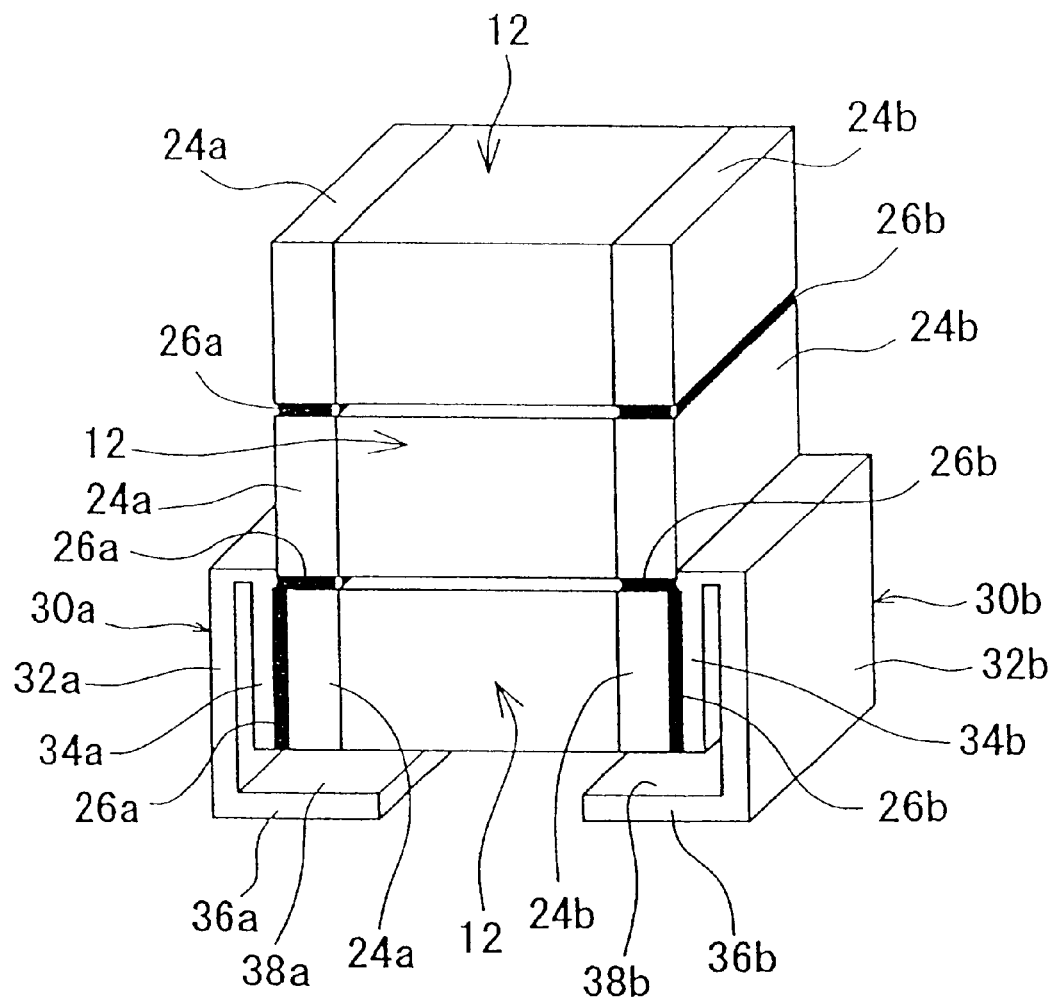
FIG. 4 is a perspective view of a monolithic capacitor according to a first comparative example.
Figure 5:
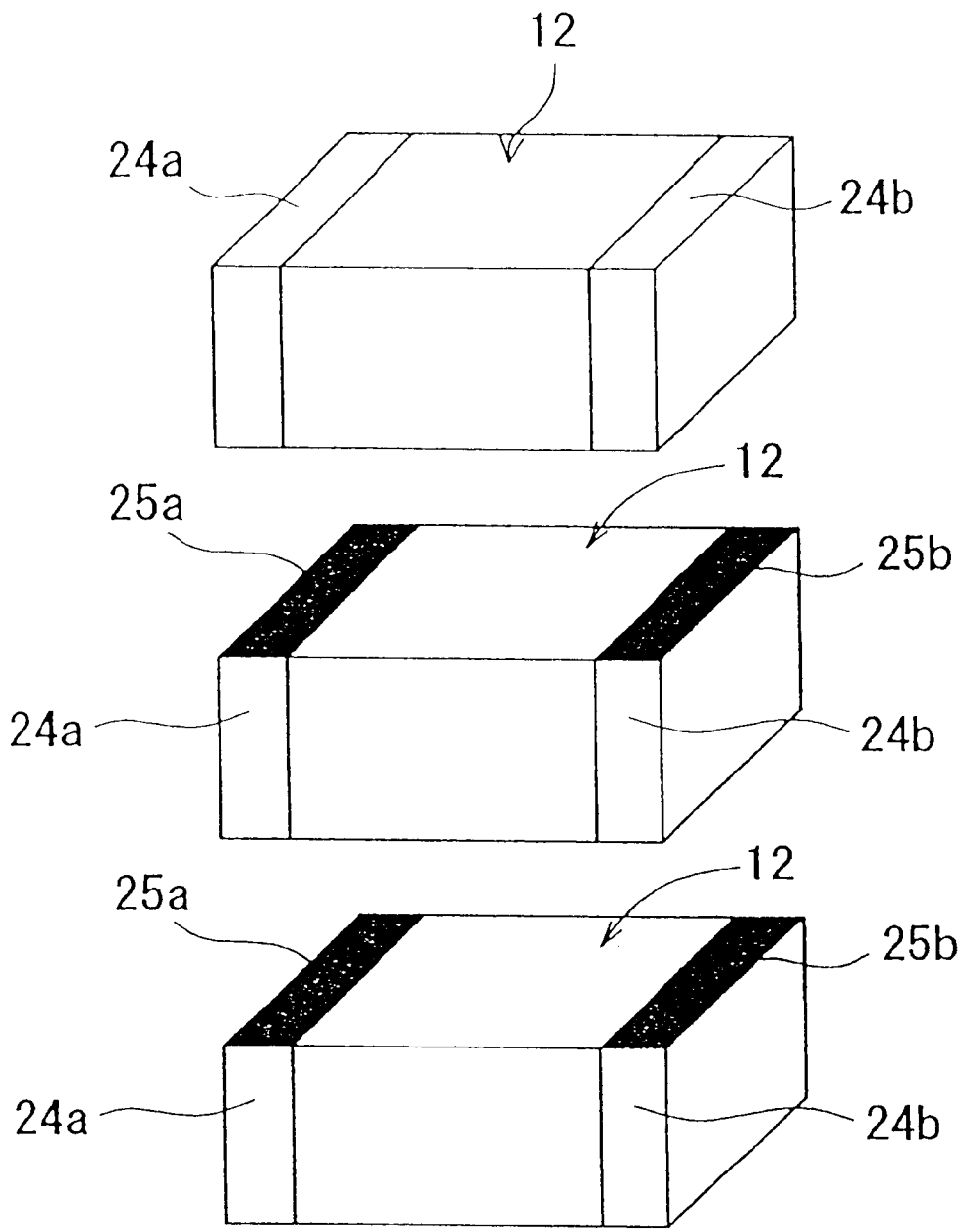
FIG. 5 is an assembly view showing a major portion of the monolithic capacitor shown in FIG. 4.

FIG. 4 is a perspective view of a monolithic capacitor according to a first comparative example, and FIG. 5 is an assembly view showing a major portion of the monolithic capacitor shown in FIG. 4. In a monolithic capacitor 11 shown in FIG. 4, in contrast to the monolithic capacitor 10 shown in FIG. 1, solder pastes 25a and 25b (refer to FIG. 5) are applied only to portions at which external electrodes of three monolithic ceramic capacitor elements 12 face each other, and metal terminals 30a and 30b made of an Fe—Cr alloy are then connected to the monolithic ceramic capacitor element 12. Therefore, solder layers 26a and 26b are disposed only on portions in which the external electrodes of the three monolithic ceramic capacitors 12 face each other and portions in which the external electrodes and the metal terminals face each other.

Figure 6:
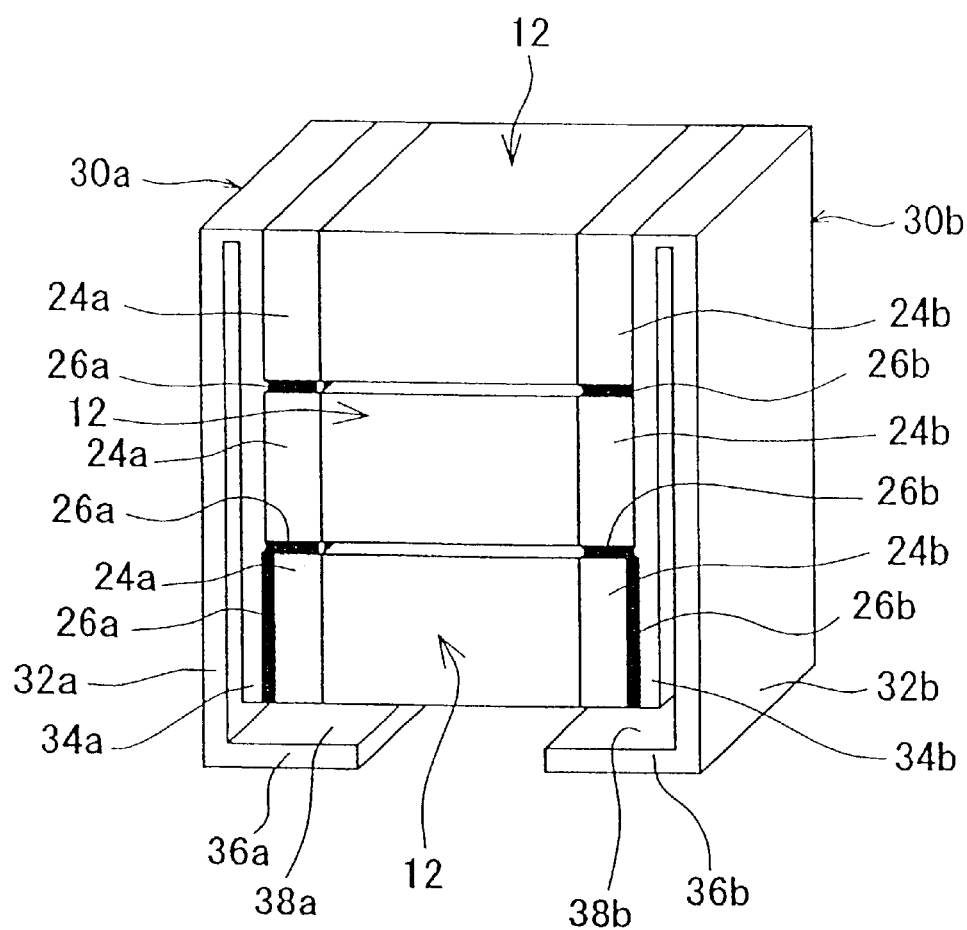
FIG. 6 is a perspective view of a monolithic capacitor according to a second comparative example.

FIG. 6 is a perspective view of a monolithic capacitor according to a second comparative example. In a monolithic capacitor 11 shown in FIG. 6, in contrast to the monolithic capacitor 10 shown in FIG. 3, a solder paste is applied only to portions in which external electrodes of three monolithic ceramic capacitor elements 12 face each other, and metal terminals 30a and 30b made of an Fe—Cr alloy are then connected to the monolithic ceramic capacitor elements 12. Therefore, solder layers 26a and 26b are disposed at portions in which the external electrodes of the three monolithic ceramic capacitor elements 12 face each other and portions in which the external electrodes of the bottom monolithic ceramic capacitor element 12 and the metal terminals face each other.

With respect to the monolithic capacitors constructed according to examples of the first and second preferred embodiments of the present invention and Comparative Examples 1 and 2, each was preferably mounted on an aluminum substrate, thermal shock cycle characteristics were observed, and the results thereof are shown in Table 1. Herein, the defect rate (number of defects/total number) was investigated in relation to the thermal shock cycle characteristics when 250 cycles of thermal shock were applied and when 500 cycles of thermal shock were applied, where a thermal change of −55° C. to 125° C. was one thermal shock cycle. A change (decrease) in electrostatic capacity of 10% or more was considered to be a defect.

TABLE 1

|  | Length of Tip Section of Metal Terminal (mm) | Material for Metal Terminal | Thermal Shock Cycle Characteristics (number of defects/total number) | |
| --- | --- | --- | --- | --- |
|  |  |  | 250 cycles | 500 cycles |
| Example 1 (FIG. 1) | 2.5 | Fe—Cr | 0/36 | 0/36 |
| Example 2 (FIG. 3) | 7.0 | Fe—Cr | 0/36 | 0/36 |

TABLE 1-continued

|  | Length of Tip Section of Metal Terminal (mm) | Material for Metal Terminal | Thermal Shock Cycle Characteristics (number of defects/ total number) | |
|---|---|---|---|---|
|  |  |  | 250 cycles | 500 cycles |
| Comparative Example 1 (FIG. 4) | 2.5 | Fe—Cr | 2/36 | 16/36 |
| Comparative Example 2 (FIG. 6) | 7.0 | Fe—Cr | 2/36 | 10/36 |

As is clear from Table 1, in Examples 1 and 2 constructed according to the first and second preferred embodiments of the present invention, in which solder layers were disposed on the entire surfaces of the external electrodes of the monolithic ceramic capacitor elements, the number of defects caused by thermal shock was zero. In contrast, in Comparative Examples 1 and 2 in which solder layers were partially formed on the surfaces of the external electrodes of the monolithic ceramic capacitor elements, defects occurred due to thermal shock.

This result occurred because when the external electrodes of the monolithic ceramic capacitor elements are partially connected by the solder layers, in the thermal shock cycle test, thermal stress is concentrated at the joints and cracks occur in the joints and the monolithic ceramic capacitor elements, resulting in a decrease in electrostatic capacity. In contrast, when the solder layers are disposed on the entire surfaces of the external electrodes of the monolithic ceramic capacitor elements, thermal stress is dispersed by the solder layers, and cracks are prevented from occurring in the joints of the monolithic ceramic capacitor elements and the monolithic ceramic capacitor elements, thus improving thermal shock resistance.

Additionally, as in Examples 1 and 2 described above, when the solder layers are disposed on the entire surfaces of the external electrodes of a plurality of monolithic ceramic capacitor elements, since the joining strength of the monolithic ceramic capacitor elements is greatly improved, it is not necessary to form the metal terminals corresponding to all the external electrodes of the monolithic ceramic capacitor elements joined together.

Furthermore, as in Examples 1 and 2 described above, since the tip section of the metal terminal imparts spring characteristics to the metal terminal, it is possible to decrease the difference in thermal expansion between the monolithic ceramic capacitor elements and the substrate on which the monolithic capacitor is mounted. Also, since the film which is resistant to soldering is formed on the internal surface of the metal terminal, the spring characteristics of the metal terminal is not impaired due to the solder attached to the internal surface of the metal terminal.

Figure 7:
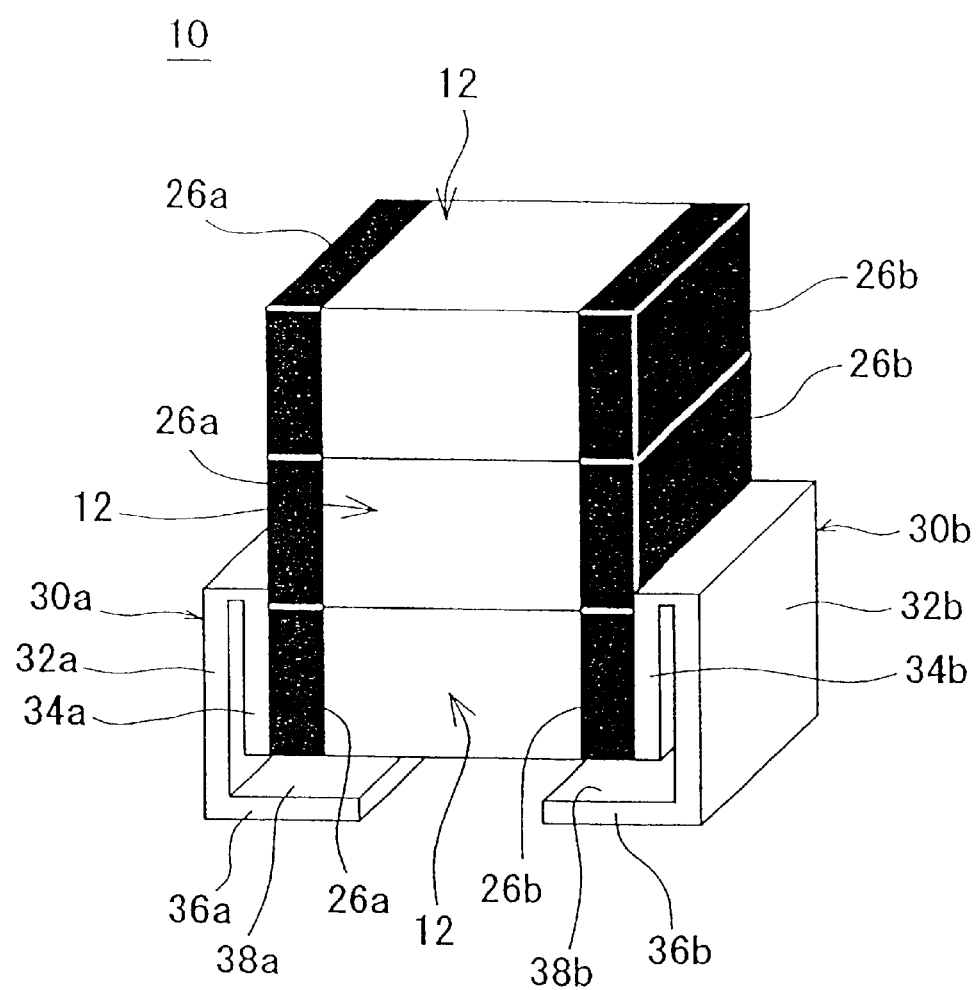
FIG. 7 is a perspective view of a monolithic capacitor according to a third preferred embodiment of the present invention.

FIG. 7 is a perspective view of a monolithic capacitor according to a third preferred embodiment of the present invention. A monolithic capacitor 10 shown in FIG. 7 preferably has substantially the same structure as that of the monolithic capacitor 10 shown in FIG. 1.

Figure 8:
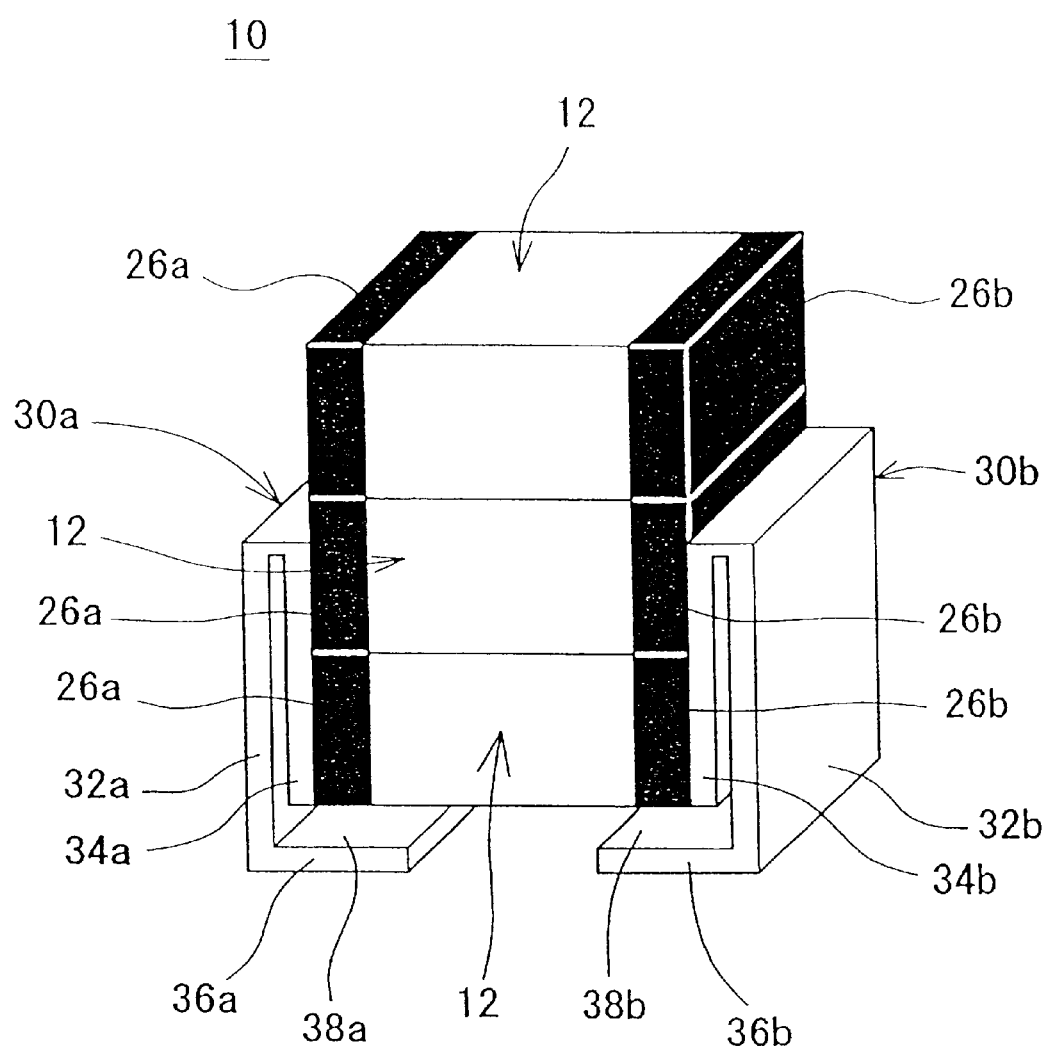
FIG. 8 is a perspective view of a monolithic capacitor according to a fourth preferred embodiment of the present invention.

FIG. 8 is a perspective view of a monolithic capacitor according to a fourth preferred embodiment of the present invention. In a monolithic capacitor 10 shown in FIG. 8, differing from the monolithic capacitor 10 shown in FIG. 7, the vertical lengths of tip sections 34a and 34b of metal terminals 30a and 30b, preferably made of an Fe—Cr alloy, are about 5.1 mm, which is substantially equal to the height of two monolithic ceramic capacitor elements 12 joined together. Accordingly, the vertical lengths of middle sections 32a and 32b of the metal terminals 30a and 30b are longer.

Figure 9:
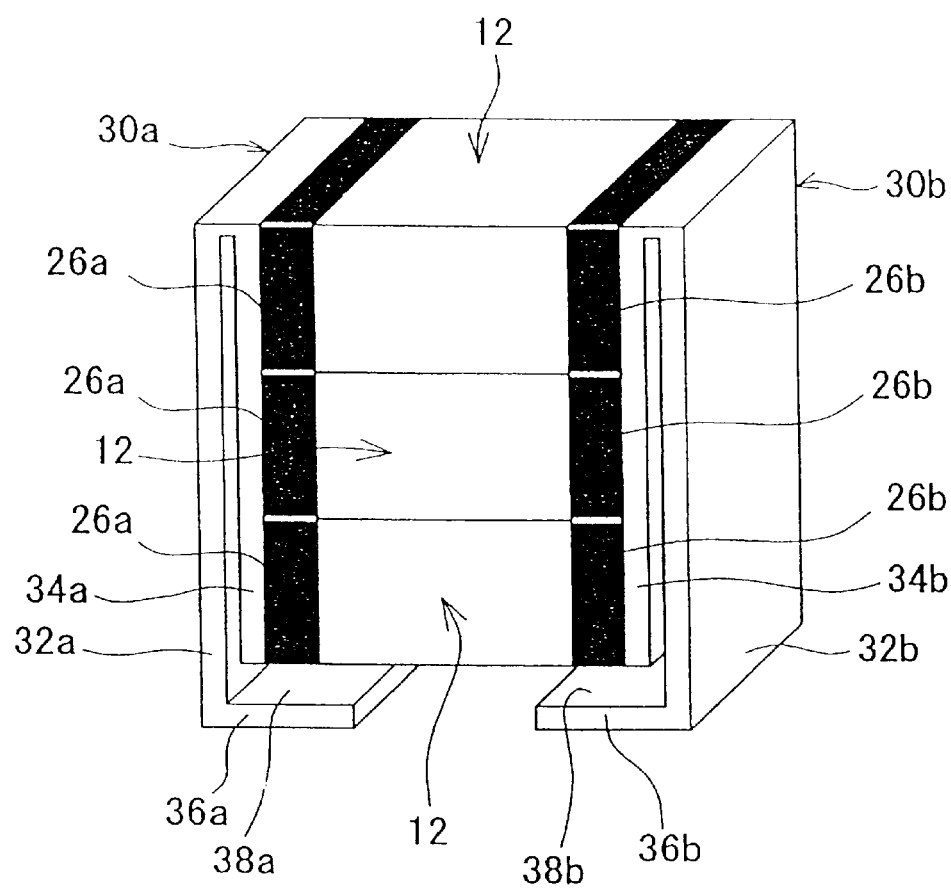
FIG. 9 is a perspective view of a monolithic capacitor according to a fifth preferred embodiment of the present invention.

FIG. 9 is a perspective view of a monolithic capacitor according to a fifth preferred embodiment of the present invention. A monolithic capacitor 10 shown in FIG. 9 preferably has substantially the same structure as that of the monolithic capacitor 10 shown in FIG. 3.

Figure 10:
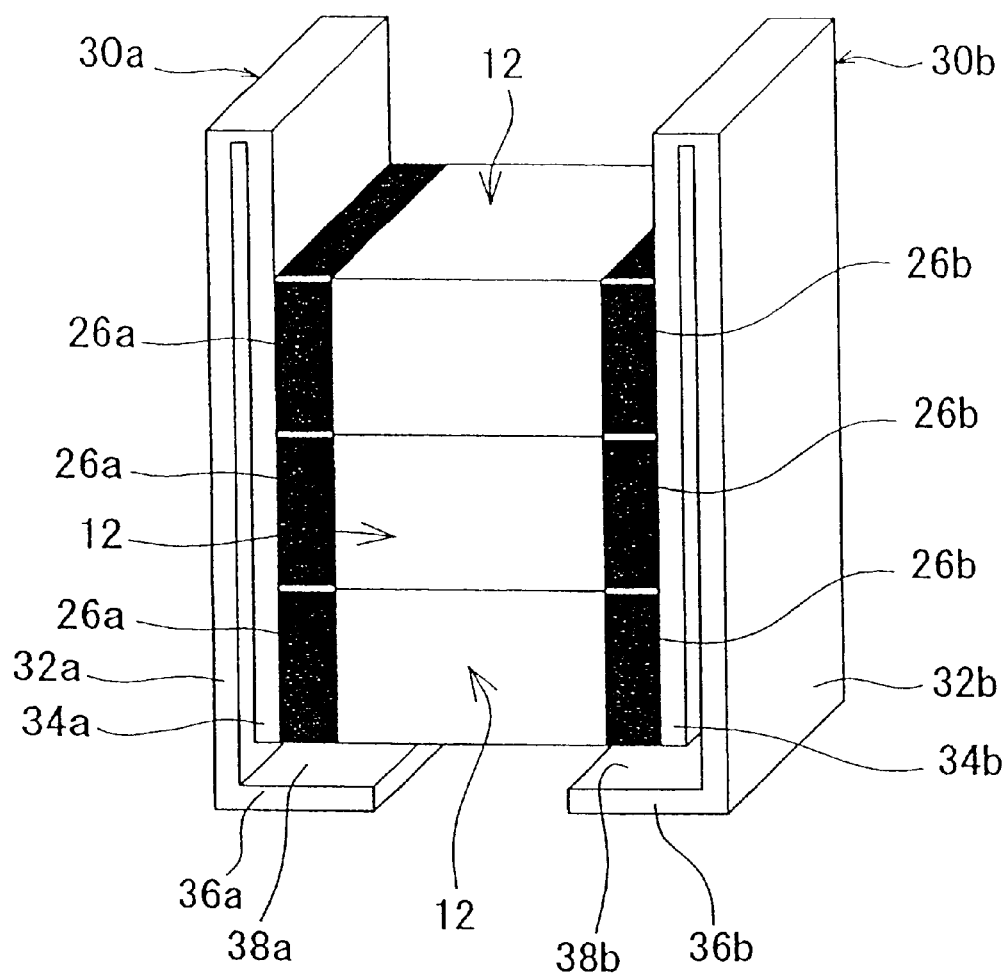
FIG. 10 is a perspective view of a monolithic capacitor according to a sixth preferred embodiment of the present invention.

FIG. 10 is a perspective view of a monolithic capacitor according to a sixth preferred embodiment of the present invention. In a monolithic capacitor 10 shown in FIG. 10, differing from the monolithic capacitor 10 shown in FIG. 9, the vertical lengths of tip sections 34a and 34b of metal terminals 30a and 30b are about 10.1 mm, which is longer than the height of three monolithic ceramic capacitor elements 12 joined together. Accordingly, the vertical lengths of the middle sections 32a and 32b are longer.

Figure 11:
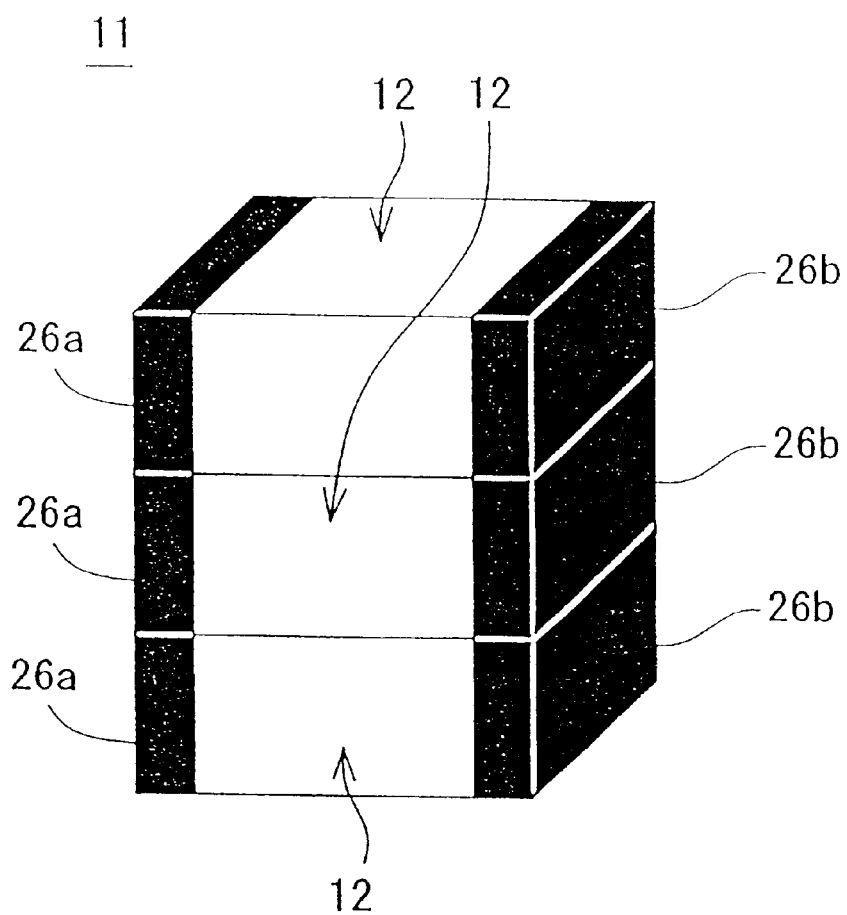
FIG. 11 is a perspective view of a monolithic capacitor according to a third comparative example.

FIG. 11 is a perspective view of a monolithic capacitor according to a third comparative example. In a monolithic capacitor 11 shown in FIG. 11, in contrast to the monolithic capacitors 10 shown in FIGS. 7 to 10, metal terminals 30a and 30b are not provided.

With respect to the monolithic capacitors in Examples 3, 4, 5, and 6, which are examples of various preferred embodiments of the present invention, and Comparative Example 3, equivalent series resistance (ESR) and equivalent series inductance (ESL) were measured, deflection was measured when each monolithic capacitor was mounted on a glass epoxy substrate, and thermal shock cycle characteristics were observed when each monolithic capacitor was mounted on an aluminum substrate. The results thereof are shown in Table 2. ESR was measured at 100 kHz and 400 kHz, and ESL was measured at 10 MHz. With respect to the thermal shock cycle characteristics, the defect rate (number of defects/total number of testing) was investigated when 250 cycles of thermal shock were applied, where a thermal change of −55° C. to 125° C. was one thermal shock cycle. A change (decrease) in electrostatic capacity of 10% or more was considered to be a defect.

TABLE 2

|  | Length of Tip Section of Metal Terminal (mm) | Material for Metal Terminal | ESR at 100 kHz (mΩ) | ESR at 400 kHz (mΩ) | ESL at 10 MHz (nH) | Deflection (mm) | Thermal Shock Cycle Characteristics (number of defects/total number) |
|---|---|---|---|---|---|---|---|
| Example 3 (FIG. 7) | 2.5 | Fe-Cr | 5.9 | 6.4 | 1.3 | 4.2 | 0/36 |
| Example 4 (FIG. 8) | 5.1 | Fe—Cr | 7.2 | 7.6 | 1.6 | 7 or more | 0/36 |
| Example 5 (FIG. 9) | 7.0 | Fe—Cr | 9.0 | 9.8 | 2.0 | 7 or more | 0/36 |

TABLE 2-continued

| | Length of Tip Section of Metal Terminal (mm) | Material for Metal Terminal | ESR at 100 kHz (mΩ) | ESR at 400 kHz (mΩ) | ESL at 10 MHz (nH) | Deflection (mm) | Thermal Shock Cycle Characteristics (number of defects/total number) |
|---|---|---|---|---|---|---|---|
| Example 6 (FIG. 10) | 10.1 | Fe—Cr | 15.0 | 15.9 | 3.2 | 7 or more | 0/36 |
| Comparative Example 3 (FIG. 11) | | | 3.0 | 0.1 | 0.8 | 1.5 | 36/36 |

As is clear from Table 2, when the metal terminal made of the Fe—Cr alloy is used, by setting the vertical length of the tip section of the metal terminal to be about 5.1 mm, an increase in ESR and ESL is minimized and the deflection and thermal shock cycle characteristics are greatly improved.

With respect to the monolithic capacitors in Examples 3, 4, 5, and 6 and Comparative Example 3, in which the metal terminals were made of brass, ESR and ESL were measured, deflection was measured when each monolithic capacitor was mounted on a glass epoxy substrate, and thermal shock cycle characteristics were observed when each monolithic capacitor was mounted on an aluminum substrate. The results thereof are shown in Table 3.

TABLE 3

| | Length of Tip Section of Metal Terminal (mm) | Material for Metal Terminal | ESR at 100 kHz (mΩ) | ESR at 400 kHz (mΩ) | ESL at 10 MHz (nH) | Deflection (mm) | Thermal Shock Cycle Characteristics (number of defects/total number) |
|---|---|---|---|---|---|---|---|
| Example 3 (FIG. 7) | 2.5 | Brass | 3.3 | 3.1 | 1.0 | 4.2 | 2/36 |
| Example 4 (FIG. 8) | 5.1 | Brass | 3.6 | 3.1 | 1.2 | 7 or more | 0/36 |
| Example 5 (FIG. 9) | 7.0 | Brass | 3.7 | 3.1 | 1.5 | 7 or more | 0/36 |
| Example 6 (FIG. 10) | 10.1 | Brass | 4.8 | 3.1 | 2.2 | 7 or more | 0/36 |
| Comparative Example 3 (FIG. 11) | | | 3.0 | 0.1 | 0.8 | 1.5 | 36/36 |

As is obvious from Table 3, when the metal terminal made of brass is used, although the thermal shock cycle characteristics are slightly degraded, ESR can be further decreased.

In the monolithic capacitors described above, if the length of the metal terminal is increased, ESR and ESL are increased, which may be disadvantageous. Therefore, the length of the metal terminal is preferably as short as possible. On the other hand, with respect to a feedback control circuit of a DC—DC converter, ESR is optimally constant in the frequency band to be adjusted, approximately, at several milli-ohms to about 10 mΩ. If the monolithic capacitor in accordance with various preferred embodiments of the present invention and a method for manufacturing the same are used, the length of the metal terminal can be greatly decreased, and accurate adjustment and control can be performed by adjusting the length of the metal terminal so as to satisfy the conditions described above.

That is, in accordance with various preferred embodiments of the present invention, it is possible to set the length of the metal terminal at the minimum required for thermal shock cycle characteristics and bending strength, and thus, ESR and ESL can be greatly decreased. In accordance with various preferred embodiments of the present invention, by adjusting the resistance and the length of the metal terminal, a monolithic capacitor having a required ESR can be easily and accurately manufactured.

FIG. 12 is a perspective view of a monolithic capacitor according to a seventh preferred embodiment of the present invention. In a monolithic capacitor 10 shown in FIG. 12, differing from the monolithic capacitor 10 shown in FIG. 1, cut-outs 40a and 40b are provided in the approximate centers in the width direction of middle sections 32a and 32b of metal terminals 30a and 30b, respectively. By providing the cut-outs 40a and 40b in the metal terminals 30a and 30b, the reactance component of the metal terminals 30a and 30b can be adjusted. Furthermore, as shown in FIG. 12, in the metal terminal 30a, a first portion of an end section 36a divided by the cut-out 40a and a second portion are connected to pattern electrodes P1 and P2, respectively, and in the metal terminal 30b, a first portion of an end section 36b divided by the cut-out 40b and a second portion are connected to pattern electrodes P3 and P4, respectively. Since electric currents flow in opposite directions in the first and second portions of the middle section 32b (32a) divided by the cut-out 40b (40a) of the metal terminal 30b (30a) so that magnetic flux is cancelled, ESL can be greatly decreased. Additionally, the cut-outs 40a and 40b are not necessarily formed in the approximate centers of the middle sections 32a and 32b of the metal terminals 30a and 30b, and may be formed in other regions of the metal terminals 30a and 30b. Also, a plurality of cut-outs may be formed.

Although three monolithic ceramic capacitor elements are used in the individual examples of preferred embodiments of the present invention as described above, two or at least four monolithic ceramic capacitor elements may be used in the present invention.

Although the external electrode of the monolithic ceramic capacitor element has a three-layered structure including a Cu layer, an Ni layer, and an Sn layer in the individual examples of preferred embodiments of the present invention as described above, the external electrode may have other structural arrangements as long as it is solderable.

Furthermore, in various preferred embodiments of the present invention, in order to improve the joining strength between the plurality of monolithic ceramic capacitor elements, a resin for joining may be inserted in the approximate centers between the monolithic ceramic capacitor elements.

The material for the metal terminal is not limited to the Fe—Cr alloy, or brass, and Ag, Ni, Cu, Fe, and Cr, or an alloy thereof, or other suitable material, may be used.

In accordance with various preferred embodiments of the present invention, a monolithic capacitor having high thermal shock resistance can be obtained. Also, in accordance with various preferred embodiments of the present invention, an increase in ESR and ESL can be avoided.

While the invention has been described with reference to preferred embodiments thereof, many modifications and variations of the present invention are possible in light of the above teachings. It is therefore to be understood that within the scope of the appended claims, the invention may be practiced otherwise than as specifically described.

What is claimed is:

1. A monolithic capacitor comprising:
   a plurality of monolithic ceramic capacitor elements having external electrodes at both ends thereof;
   solder layers arranged to cover the entire surfaces of the external electrodes of the monolithic ceramic capacitor elements; and
   metal terminals electrically connected to the external electrodes of the monolithic ceramic capacitor elements;
   wherein the monolithic ceramic capacitor elements are stacked on each other and joined to each other via the solder layers, and the external electrodes of the monolithic ceramic capacitor elements are electrically connected to each other via the solder layers.

2. A monolithic capacitor according to claim 1, wherein the metal terminals are directly connected to at least one of the monolithic ceramic capacitor elements by the solder layers.

3. A monolithic capacitor according to claim 2, wherein the metal terminals are not directly connected to at least one of the other monolithic ceramic capacitor elements.

4. A monolithic capacitor according to claim 1, wherein each of the metal terminals includes a middle section, a tip section located on one edge of the middle section so as to face the middle section with a space therebetween, and an end section located on the other edge of the middle section, and the tip section is arranged to impart spring characteristics to the metal terminal and is connected to the external electrode of the monolithic ceramic capacitor element by one of the solder layers.

5. A monolithic capacitor according to claim 4, wherein a film that is resistant to soldering is disposed on the internal surface of the metal terminal.

6. A monolithic capacitor according to claim 1, wherein the metal terminal include at least one cut-out arranged to adjust the reactance component of the metal terminals.

7. A monolithic capacitor according to claim 1, wherein each of the plurality of monolithic ceramic capacitor elements includes a laminate having a plurality of dielectric layers and a plurality of internal electrodes alternately disposed on the plurality of dielectric layers.

8. A monolithic capacitor according to claim 1, wherein at least one of the external electrodes includes a Cu layer, an Ni layer, and an Sn layer.

9. A monolithic capacitor according to claim 1, wherein the plurality of monolithic ceramic capacitor elements includes at least three monolithic ceramic capacitor elements and the at least three monolithic ceramic capacitor elements are joined together.

10. A monolithic capacitor according to claim 1, wherein the metal terminals are made of an Fe—Cr alloy.

11. A monolithic capacitor according to claim 1, wherein the solder layers are made of a high-temperature solder containing Sn.

12. A monolithic capacitor according to claim 1, wherein the metal terminals include tip sections which are connected to the external electrodes of one of the plurality of monolithic ceramic capacitor elements.

13. A monolithic capacitor according to claim 12, wherein vertical lengths of tip sections of the metal terminals are substantially equal to the height of the plurality of monolithic capacitor elements joined together.

14. A monolithic capacitor according to claim 13, wherein the number of monolithic capacitor elements joined together is three.

15. A monolithic capacitor according to claim 13, wherein the number of monolithic capacitor elements joined together is two.

16. A monolithic capacitor according to claim 12, wherein vertical lengths of tip sections of the metal terminals are longer than the height of the plurality of monolithic capacitor elements joined together.

17. A monolithic capacitor according to claim 1, wherein at least one cut-out is formed in each of the metal terminals.

18. A monolithic capacitor according to claim 17, wherein the at least one cut-out is located in the approximate center of a middle section of each of the metal terminals.

19. A monolithic capacitor according to claim 1, wherein a plurality of cut-outs are formed in each of the metal terminals.

20. A monolithic capacitor according to claim 19, wherein the plurality of cut-outs are located in the approximate centers of middle sections of the metal terminals.

* * * * *